United States Patent
Ahn et al.

(10) Patent No.: US 8,628,615 B2
(45) Date of Patent: *Jan. 14, 2014

(54) TITANIUM-DOPED INDIUM OXIDE FILMS

(75) Inventors: Kie Y. Ahn, Chappaqua, NY (US);
Leonard Forbes, Corvallis, OR (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/615,906

(22) Filed: Sep. 14, 2012

(65) Prior Publication Data

US 2013/0000544 A1      Jan. 3, 2013

Related U.S. Application Data

(63) Continuation of application No. 12/551,023, filed on Aug. 31, 2009, now Pat. No. 8,273,177, which is a continuation of application No. 11/400,836, filed on Apr. 7, 2006, now Pat. No. 7,582,161.

(51) Int. Cl.
*C30B 23/02* (2006.01)

(52) U.S. Cl.
USPC .............................. 117/105; 117/108; 117/109

(58) Field of Classification Search
USPC .......................................... 117/105, 108, 109
See application file for complete search history.

(56) References Cited

U.S. PATENT DOCUMENTS

| | | | |
|---|---|---|---|
| 4,416,933 A | 11/1983 | Antson et al. | |
| 5,374,570 A | 12/1994 | Nasu et al. | |
| 5,496,597 A | 3/1996 | Soininen et al. | |
| 5,672,214 A | 9/1997 | Arthur et al. | |
| 5,712,528 A | 1/1998 | Barrow et al. | |
| 5,714,274 A | 2/1998 | Sugiura et al. | |
| 5,834,053 A | 11/1998 | Dye et al. | |
| 5,949,502 A | 9/1999 | Matsunaga et al. | |
| 6,113,977 A | 9/2000 | Soininen et al. | |
| 6,207,302 B1 | 3/2001 | Sugiura et al. | |
| 6,248,605 B1 | 6/2001 | Harkonen et al. | |
| 6,342,277 B1 | 1/2002 | Sherman | |
| 6,358,632 B1 | 3/2002 | Dickey et al. | |
| 6,436,541 B1 | 8/2002 | Sopko et al. | |
| 6,476,969 B2 | 11/2002 | Oka et al. | |
| 6,495,436 B2 | 12/2002 | Ahn et al. | |
| 6,514,828 B2 | 2/2003 | Ahn et al. | |
| 6,534,420 B2 | 3/2003 | Ahn et al. | |
| 6,551,399 B1 | 4/2003 | Sneh et al. | |
| 6,608,378 B2 | 8/2003 | Ahn et al. | |
| 6,616,986 B2 | 9/2003 | Sherman | |
| 6,652,924 B2 | 11/2003 | Sherman | |
| 6,661,058 B2 | 12/2003 | Ahn et al. | |

(Continued)

OTHER PUBLICATIONS

"U.S. Appl. No. 11/400,836, Final Office Action mailed Feb. 19, 2009", 9 pgs.

(Continued)

*Primary Examiner* — Bob M Kunemund
(74) *Attorney, Agent, or Firm* — Schwegman, Lundberg & Woessner, P.A.

(57) ABSTRACT

An apparatus and methods of forming the apparatus include a film of transparent conductive titanium-doped indium oxide for use in a variety of configurations and systems. The film of transparent conductive titanium-doped indium oxide may be structured as one or more monolayers. The film of transparent conductive titanium-doped indium oxide may be formed using atomic layer deposition.

20 Claims, 6 Drawing Sheets

(56) References Cited

U.S. PATENT DOCUMENTS

| | | |
|---|---|---|
| 6,673,701 B1 | 1/2004 | Marsh et al. |
| 6,710,543 B2 | 3/2004 | Inoue et al. |
| 6,730,163 B2 | 5/2004 | Vaartstra |
| 6,730,164 B2 | 5/2004 | Vaartstra et al. |
| 6,767,795 B2 | 7/2004 | Ahn et al. |
| 6,781,307 B2 | 8/2004 | Lee |
| 6,784,049 B2 | 8/2004 | Vaartstra |
| 6,787,413 B2 | 9/2004 | Ahn |
| 6,794,284 B2 | 9/2004 | Vaartstra |
| 6,821,655 B1 | 11/2004 | Ohta et al. |
| 6,844,203 B2 | 1/2005 | Ahn et al. |
| 6,863,725 B2 | 3/2005 | Vaartstra et al. |
| 6,893,984 B2 | 5/2005 | Ahn et al. |
| 6,900,122 B2 | 5/2005 | Ahn et al. |
| 6,921,702 B2 | 7/2005 | Ahn et al. |
| 6,952,032 B2 | 10/2005 | Forbes et al. |
| 6,953,730 B2 | 10/2005 | Ahn et al. |
| 6,954,570 B2 | 10/2005 | Hunt et al. |
| 6,958,300 B2 | 10/2005 | Vaartstra et al. |
| 6,958,302 B2 | 10/2005 | Ahn et al. |
| 6,958,937 B2 | 10/2005 | Forbes |
| 6,960,538 B2 | 11/2005 | Ahn et al. |
| 6,967,159 B2 | 11/2005 | Vaartstra |
| 6,984,592 B2 | 1/2006 | Vaartstra |
| 6,995,081 B2 | 2/2006 | Vaartstra |
| 7,030,042 B2 | 4/2006 | Vaartstra et al. |
| 7,041,609 B2 | 5/2006 | Vaartstra |
| 7,077,902 B2 | 7/2006 | Vaartstra |
| 7,087,481 B2 | 8/2006 | Vaartstra et al. |
| 7,112,485 B2 | 9/2006 | Vaartstra |
| 7,115,166 B2 | 10/2006 | Vaartstra et al. |
| 7,115,528 B2 | 10/2006 | Vaartstra et al. |
| 7,122,464 B2 | 10/2006 | Vaartstra |
| 7,125,815 B2 | 10/2006 | Vaartstra |
| 7,196,007 B2 | 3/2007 | Vaartstra |
| 7,235,501 B2 | 6/2007 | Ahn et al. |
| 7,250,367 B2 | 7/2007 | Vaartstra et al. |
| 7,253,122 B2 | 8/2007 | Vaartstra |
| 7,271,077 B2 | 9/2007 | Vaartstra et al. |
| 7,294,556 B2 | 11/2007 | Vaartstra |
| 7,300,870 B2 | 11/2007 | Vaartstra |
| 7,332,442 B2 | 2/2008 | Vaartstra et al. |
| 7,365,027 B2 | 4/2008 | Ahn et al. |
| 7,368,402 B2 | 5/2008 | Vaartstra et al. |
| 7,374,617 B2 | 5/2008 | Vaartstra |
| 7,374,964 B2 | 5/2008 | Ahn et al. |
| 7,390,756 B2 | 6/2008 | Ahn et al. |
| 7,393,736 B2 | 7/2008 | Ahn et al. |
| 7,399,666 B2 | 7/2008 | Ahn et al. |
| 7,410,910 B2 | 8/2008 | Ahn et al. |
| 7,410,918 B2 | 8/2008 | Vaarstra |
| 7,491,995 B2 | 2/2009 | Forbes |
| 7,498,247 B2 | 3/2009 | Ahn et al. |
| 7,508,648 B2 | 3/2009 | Ahn et al. |
| 7,510,983 B2 | 3/2009 | Ahn et al. |
| 7,560,395 B2 | 7/2009 | Ahn |
| 7,572,695 B2 | 8/2009 | Ahn et al. |
| 7,582,161 B2 * | 9/2009 | Ahn et al. ............ 117/86 |
| 2002/0079835 A1 | 6/2002 | Lee |
| 2002/0192974 A1 | 12/2002 | Ahn et al. |
| 2002/0192975 A1 | 12/2002 | Ahn et al. |
| 2003/0043637 A1 | 3/2003 | Forbes et al. |
| 2003/0045078 A1 | 3/2003 | Ahn et al. |
| 2003/0168001 A1 | 9/2003 | Sneh |
| 2003/0176065 A1 | 9/2003 | Vaartstra |
| 2003/0200917 A1 | 10/2003 | Vaartstra |
| 2003/0207032 A1 | 11/2003 | Ahn et al. |
| 2003/0207540 A1 | 11/2003 | Ahn et al. |
| 2003/0227033 A1 | 12/2003 | Ahn et al. |
| 2003/0228747 A1 | 12/2003 | Ahn et al. |
| 2004/0033679 A1 | 2/2004 | Jacobson et al. |
| 2004/0040494 A1 | 3/2004 | Vaartstra et al. |
| 2004/0040501 A1 | 3/2004 | Vaartstra |
| 2004/0043151 A1 | 3/2004 | Vaartstra |
| 2004/0043541 A1 | 3/2004 | Ahn et al. |
| 2004/0043569 A1 | 3/2004 | Ahn et al. |
| 2004/0043600 A1 | 3/2004 | Vaartstra |
| 2004/0043604 A1 | 3/2004 | Vaartstra |
| 2004/0043625 A1 | 3/2004 | Vaartstra et al. |
| 2004/0043630 A1 | 3/2004 | Vaartstra et al. |
| 2004/0043632 A1 | 3/2004 | Vaartstra |
| 2004/0043633 A1 | 3/2004 | Vaartstra |
| 2004/0043634 A1 | 3/2004 | Vaartstra |
| 2004/0043635 A1 | 3/2004 | Vaartstra |
| 2004/0043636 A1 | 3/2004 | Vaartstra et al. |
| 2004/0110391 A1 | 6/2004 | Ahn et al. |
| 2004/0126954 A1 | 7/2004 | Vaartstra et al. |
| 2004/0137280 A1 | 7/2004 | Abe et al. |
| 2004/0144980 A1 | 7/2004 | Ahn et al. |
| 2004/0152254 A1 | 8/2004 | Vaartstra et al. |
| 2004/0164357 A1 | 8/2004 | Ahn et al. |
| 2004/0175882 A1 | 9/2004 | Ahn et al. |
| 2004/0183108 A1 | 9/2004 | Ahn et al. |
| 2004/0185654 A1 | 9/2004 | Ahn et al. |
| 2004/0187968 A1 | 9/2004 | Vaartstra |
| 2004/0197946 A1 | 10/2004 | Vaartstra et al. |
| 2004/0214399 A1 | 10/2004 | Ahn et al. |
| 2004/0219746 A1 | 11/2004 | Vaartstra et al. |
| 2004/0222476 A1 | 11/2004 | Ahn et al. |
| 2004/0262700 A1 | 12/2004 | Ahn et al. |
| 2005/0009266 A1 | 1/2005 | Vaartstra |
| 2005/0009368 A1 | 1/2005 | Vaartstra |
| 2005/0009370 A1 | 1/2005 | Ahn et al. |
| 2005/0019978 A1 | 1/2005 | Vaartstra et al. |
| 2005/0020017 A1 | 1/2005 | Ahn et al. |
| 2005/0023594 A1 | 2/2005 | Ahn et al. |
| 2005/0023624 A1 | 2/2005 | Ahn et al. |
| 2005/0023625 A1 | 2/2005 | Ahn et al. |
| 2005/0023626 A1 | 2/2005 | Ahn et al. |
| 2005/0026349 A1 | 2/2005 | Forbes et al. |
| 2005/0028733 A1 | 2/2005 | Vaartstra |
| 2005/0029547 A1 | 2/2005 | Ahn et al. |
| 2005/0029604 A1 | 2/2005 | Ahn et al. |
| 2005/0029605 A1 | 2/2005 | Ahn et al. |
| 2005/0032292 A1 | 2/2005 | Ahn et al. |
| 2005/0032360 A1 | 2/2005 | Vaartstra |
| 2005/0037563 A1 | 2/2005 | Ahn |
| 2005/0054165 A1 | 3/2005 | Ahn et al. |
| 2005/0064130 A1 | 3/2005 | Nishikawa |
| 2005/0077519 A1 | 4/2005 | Ahn et al. |
| 2005/0098205 A1 | 5/2005 | Roscheisen et al. |
| 2005/0124171 A1 | 6/2005 | Vaartstra |
| 2005/0124175 A1 | 6/2005 | Ahn et al. |
| 2005/0136689 A9 | 6/2005 | Vaartstra |
| 2005/0145957 A1 | 7/2005 | Ahn et al. |
| 2005/0151210 A1 | 7/2005 | Li et al. |
| 2005/0158973 A1 | 7/2005 | Ahn et al. |
| 2005/0160981 A9 | 7/2005 | Vaartstra |
| 2005/0164521 A1 | 7/2005 | Ahn et al. |
| 2005/0215015 A1 | 9/2005 | Ahn et al. |
| 2005/0218462 A1 | 10/2005 | Ahn et al. |
| 2005/0221006 A1 | 10/2005 | Vaartstra |
| 2005/0227442 A1 | 10/2005 | Ahn et al. |
| 2005/0269613 A1 | 12/2005 | Li et al. |
| 2005/0287804 A1 | 12/2005 | Vaaartstra |
| 2005/0287819 A1 | 12/2005 | Vaartstra et al. |
| 2006/0024975 A1 | 2/2006 | Ahn et al. |
| 2006/0043504 A1 | 3/2006 | Ahn et al. |
| 2006/0046505 A1 | 3/2006 | Ahn et al. |
| 2006/0046521 A1 | 3/2006 | Vaartstra et al. |
| 2006/0046522 A1 | 3/2006 | Ahn et al. |
| 2006/0048711 A1 | 3/2006 | Vaartstra |
| 2006/0062916 A1 | 3/2006 | Won |
| 2006/0125030 A1 | 6/2006 | Ahn et al. |
| 2006/0172485 A1 | 8/2006 | Vaartstra |
| 2006/0223337 A1 | 10/2006 | Ahn et al. |
| 2006/0231017 A1 | 10/2006 | Vaartstra |
| 2006/0244082 A1 | 11/2006 | Ahn et al. |
| 2006/0252244 A1 | 11/2006 | Vaartstra et al. |
| 2006/0252279 A1 | 11/2006 | Vaartstra |
| 2006/0258175 A1 | 11/2006 | Vaartstra et al. |
| 2006/0261389 A1 | 11/2006 | Vaartstra |
| 2006/0292788 A1 | 12/2006 | Vaartstra |
| 2007/0006798 A1 | 1/2007 | Vaartstra et al. |

(56) References Cited

U.S. PATENT DOCUMENTS

| | | | |
|---|---|---|---|
| 2007/0018214 A1 | 1/2007 | Ahn et al. |
| 2007/0049023 A1 | 3/2007 | Ahn et al. |
| 2007/0049054 A1 | 3/2007 | Ahn et al. |
| 2007/0134931 A1 | 6/2007 | Ahn et al. |
| 2007/0134942 A1 | 6/2007 | Ahn et al. |
| 2007/0144438 A1 | 6/2007 | Vaartstra |
| 2007/0155190 A1 | 7/2007 | Vaartstra et al. |
| 2007/0158765 A1 | 7/2007 | Ahn et al. |
| 2007/0161260 A1 | 7/2007 | Vaartstra |
| 2007/0166999 A1 | 7/2007 | Vaartstra |
| 2007/0234949 A1 | 10/2007 | Ahn et al. |
| 2007/0295273 A1 | 12/2007 | Vaartstra |
| 2008/0064210 A1 | 3/2008 | Vaartstra |
| 2008/0102629 A1 | 5/2008 | Vaartstra |
| 2009/0314345 A1 | 12/2009 | Ahn et al. |

OTHER PUBLICATIONS

"U.S. Appl. No. 11/400,836, Non Final Office Action mailed Feb. 13, 2008", 7 pgs.
"U.S. Appl. No. 11/400,836, Non-Final Office Action mailed Sep. 2, 2008", 5 pgs.
"U.S. Appl. No. 11/400,836, Notice of Allowance mailed Apr. 30, 2009", 4 pgs.
"U.S. Appl. No. 11/400,836, Response filed Dec. 2, 2008 to Non-Final Office Action mailed Sep. 2, 2008", 17 pgs.
"U.S. Appl. No. 11/400,836, Response filed Apr. 20, 2009 to Final Office Action mailed Feb. 19, 2009", 10 pgs.
"U.S. Appl. No. 11/400,836, Response filed May 13, 2008 to Non Final Office Action mailed Feb. 13, 2008", 15 pgs.
"U.S. Appl. No. 12/551,023 , Response filed May 7, 2012 to Final Office Action mailed Mar. 7, 2012", 10 pgs.
"U.S. Appl. No. 12/551,023, Final Office Action mailed Mar. 7, 2012", 7 pgs.
"U.S. Appl. No. 12/551,023, Non Final Office Action mailed Oct. 4, 2011", 5 pgs.
"U.S. Appl. No. 12/551,023, Notice of Allowance mailed May 22, 2012", 5 pgs.
"U.S. Appl. No. 12/551,023, PTO Response to 312 Amendment mailed Aug. 27, 2012", 2 pgs.
"U.S. Appl. No. 12/551,023, Response filed Jan. 4, 2012 to Non Final Office Action mailed Oct. 4, 2011", 12 pgs.
Aarik, J., et al., "Atomic layer growth of epitaxial TiO/sub 2/ thin films from TiCl/sub 4/ and H/sub 2/O on alpha -Al/sub 2/O/sub 3/ substrates", Journal of Crystal Growth, 242(1-2), (2002), 189-198.
Asikainen, Timo, "Growth of indium-tin-oxide thin films by atomic layer epitaxy", J. Electrochem. Soc. vol. 142, No. 10, (Oct. 1995), 3538-3541.
Delahoy, A. E., et al., "CIGS Devices, Modules, and Processing Using a Hybrid Evaporation/Sputtering Process", 19th European Photovoltaic Solora Energy Conference and Exhibition, Paris, (Jun. 7-11, 2004), 4 pages.
El Hichou, A., et al., "Effect of substrate temperature on electrical, structural, optical and cathodoluminescent properties of In2O3-Sn thin films prepared by spray pyrolysis", Thin Solid Films 458, (2004), 263-268.
Ginley, David S., "Transparent conducting oxides", MRS Bulletin, (Aug. 2000), 15-18.
Howson, R. P., et al., "The formation and control of direct current magnetron discharges for the high-rate reactive processing of thin films", J. Vac. Sci. Technol. A. 7(3), (May/Jun. 1989), 1230-1234.
Leskela, M., "ALD precursor chemistry: Evolution and future challenges", J. Phys. IV France, 9, (1999), 837-852.
Meng, Yang, "A new transparent conductive thin film In2O3:Mo", Thin Solid Films 394, (2001), 219-223.
Meng, Yang, "Molybdemum-doped indium oxide transparent conductive thin films", J. Vac. Sci. Technol. A 20(1), (Jan./Feb. 2002), 288-290.
Min, Jae-Sik, et al., "Metal-Organic Atomic-Layer Deposition of Titanium-Silicon-Nitride Films", Applied Physics Letters, 75(11), (Sep. 13, 1999), 1521-1523.
Minami, Tadatsugu, "New n-Type Transparent Conducting Oxides", MRS Bulletin, (Aug. 2000), 38-44.
Perkins, J. D., et al., "Combinatorial Optimization of Transparent Conducting Oxides (TCOs) for PV", Prepared for the 31st IEEE Photovoltaics Specialists Conference and Exhibition, Lake Buena Vista, Florida, NREL/CP-520-37420, (Feb. 2005), 1-6.
Safi, I., et al., "The properties of reactively-sputtered, stoichiometry-controlled and optimum-conductivity transparent indium oxide films as a function of their titanium, aluminium and zing content; comparisons with the use of tin as a dopant", Thin Solid Films 343-344, (1999), 115-118.
Schuisky, Mikael, "Atomic Layer Chemical Vapor Deposition of TiO2 Low Temperature Epitaxy fo Rutile and Anatase", Journal of the Electrochemical Society, 147(9), (2000), 3319-3325.
Sneh, Ofer, "Thin film atomic layer deposition equipment for semiconductor processing", Thin Solid Films, 402(1-2), Preparation and Characterization, Elsevier Sequoia, NL, vol. 402, No. 1-2, (2002), 248-261.
Suntola, T., "Atomic Layer Epitaxy", Handbook of Crystal Growth, 3; Thin Films of Epitaxy, Part B: Growth Mechanics and Dynamics, Amsterdam, (1994), 601-663.
Suntola, Tuomo, "Atomic layer epitaxy", Thin Solid Films, 216(1), (Aug. 28, 1992), 84-89.
Van Hest, M.F. A.M., et al., "Titanium-doped indium oxide: A high-mobility transparent conductor", Applied Physics Letters 87, 032111, (2005), 032111-1-032111-3.
Vehkamaki, Marko, "Growth of SrTiO3 and BaTiO3 Thin Films by Atomic Layer Deposition", Electrochemical and Solid-State Letters, vol. 2, No. 10, (Oct. 1999), 504-506.
Warmsingh, C., et al., "High-mobility transparent conducting Mo-doped In2O3 thin films by pulsed laser deposition", Journal of Applied Physics, vol. 95, No. 7, (Apr. 1, 2004), 3831-3833.
Wilk, G. D., "High-K gate dielectrics: Current status and materials properties considerations", Journal of Applied Physics, 89(10), (May 2001), 5243-5275.
Yamaguchi, Mika, et al., "Characteristics of indium tin oxide thin films prepared using elecron beam evaporation", Thin Solid Films 447-448, (2004), 115-118.
Yoshida, Yuki, "Development of radio-frequency magnetron sputtered indium molybdenum oxide", J. Vac. Sci. Technol. A 21(4), (Jul./Aug. 2003), 1092-1097.

* cited by examiner

TITANIUM-DOPED INDIUM OXIDE FILMS

RELATED APPLICATIONS

This application is a Continuation Application of U.S. application Ser. No. 12/551,023, filed on 31 Aug. 2009, now U.S. Pat. No. 8,273,177 which is a Continuation Application of U.S. application Ser. No. 11/400,836, filed 7 Apr. 2006, now issued as U.S. Pat. No. 7,582,161, which are incorporated herein by reference in their entirety.

TECHNICAL FIELD

This application relates generally to devices having a transparent conductive oxide film and fabrication of such devices.

BACKGROUND

Transparent conductive oxide (TCO) materials are components in a variety of devices including flat-panel displays, photovoltaic cells, smart windows, light emitting diodes, and optical waveguides. The performance of a TCO may be related both to the conductivity of the TCO and to the optical transparency of the TCO. According to the Drude model, conductivity is related to the carrier concentration and the mobility of the carrier. However, with increased carrier concentration in a material, there may be decrease in optical transparency. To increase conductivity without decreasing optical transparency, the carrier mobility in a material should be increased without increasing carrier concentration.

Currently, tin-doped indium oxide (ITO) is a transparent conductive oxide material for commercial applications. ITO has good optical properties and good electrical properties. Another material that has been considered is indium oxide doped with molybdenum. Using Mo-doped indium oxide can provide a TCO material that has a high carrier mobility of about $70 \text{ cm}^2\text{V}^{-1}\text{s}^{-1}$. Combinatorial deposition and analytical techniques have been applied to sputtered films of $In_2O_3$ doped with titanium up to 7 atomic percent concentration. These sputtered films were determined to have a maximum mobility of $83.3 \text{ cm}^2\text{V}^{-1}\text{s}^{-1}$ at a titanium doping of 1.7 atomic percent and a conductivity of $6260 \text{ }\Omega^{-1}\text{cm}^{-1}$ for titanium doping of 2.8 atomic percent. The optical transparency for these sputtered Ti-doped indium oxide films has been measured to be greater than 85% over a wide spectral range. In addition, for these Ti-doped indium oxide films with titanium doping concentrations between 1 and 3 atomic percent, one carrier is generated for every titanium atom.

DETAILED DESCRIPTION

Figure 1A:
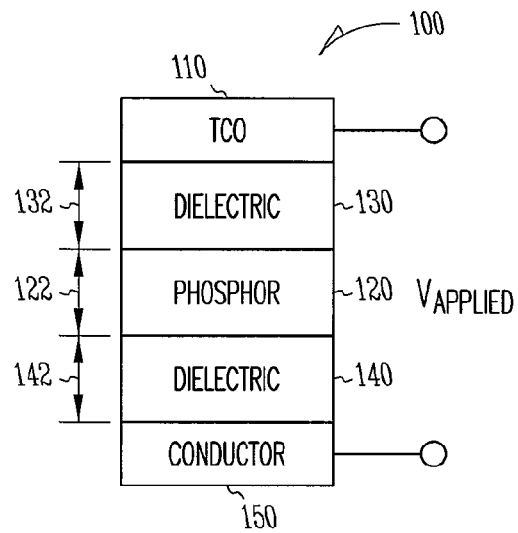
FIG. 1A illustrates a block diagram of an embodiment of a flat panel display having a transparent conductive titanium-doped indium oxide film as a transparent conductive oxide layer.

The following detailed description refers to the accompanying drawings that show, by way of illustration, embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments are not necessarily mutually exclusive, as some embodiments can be combined with one or more other embodiments to form new embodiments.

The term substrate used in the following description includes any structure having an exposed surface with which to form a structure, e.g., an integrated circuit (IC) structure. The term substrate may also be used to refer to structures during processing, and may include other layers that have been fabricated thereupon. A substrate may include doped and undoped semiconductors, epitaxial semiconductor layers supported by a base semiconductor or insulator, as well as other semiconductor structures well known to one skilled in the art. The term conductor is understood to generally include n-type and p-type semiconductors and the term insulator or dielectric is defined to include any material that is less electrically conductive than the materials referred to as conductors. The following detailed description is, therefore, not to be taken in a limiting sense.

In an embodiment, a titanium-doped indium oxide film may be formed using atomic layer deposition (ALD). In an embodiment, a method includes forming a film of titanium-doped indium oxide using ALD to form a transparent conductive oxide film. Embodiments include structures and methods to form such structures for flat-panel displays, photovoltaic cells, smart windows, light emitting diodes, optical waveguides, and other apparatus containing a titanium-doped indium oxide layer structured as one or more monolayers. Forming such structures using atomic layer deposition may allow control of transitions between material layers. As a result of such control, atomic layer deposited titanium-doped indium oxide films may have an engineered transition with a substrate surface on which it is deposited. Constructing titanium-doped indium oxide films using ALD provides transparent conductive oxide films having a mobility to increase electrical conductivity without sacrificing optical transparency.

ALD, also known as atomic layer epitaxy (ALE), is a modification of chemical vapor deposition (CVD) and is also called "alternatively pulsed-CVD." In ALD, gaseous precursors are introduced one at a time to the substrate surface mounted within a reaction chamber (or reactor). This introduction of the gaseous precursors takes the form of pulses of each gaseous precursor. In a pulse of a precursor gas, the precursor gas is made to flow into a specific area or region for a short period of time. Between the pulses, the reaction chamber may be purged with a gas, where the purging gas may be an inert gas. Between the pulses, the reaction chamber may be evacuated. Between the pulses, the reaction chamber may be purged with a gas and evacuated.

In a chemisorption-saturated ALD (CS-ALD) process, during the first pulsing phase, reaction with the substrate occurs with the precursor saturatively chemisorbed at the substrate surface. Subsequent pulsing with a purging gas removes precursor excess from the reaction chamber.

The second pulsing phase introduces another precursor on the substrate where the growth reaction of the desired film takes place. Subsequent to the film growth reaction, reaction byproducts and precursor excess are purged from the reaction chamber. With favourable precursor chemistry where the precursors adsorb and react with each other aggressively on the substrate, one ALD cycle can be performed in less than one second in properly designed flow type reaction chambers. Typically, precursor pulse times range from about 0.5 sec to about 2 to 3 seconds. Pulse times for purging gases may be significantly longer, for example, pulse times of about 5 to about 30 seconds.

In ALD, the saturation of all the reaction and purging phases makes the growth self-limiting. This self-limiting growth results in large area uniformity and conformality, which has important applications for such cases as planar substrates, deep trenches, and in the processing of porous silicon and high surface area silica and alumina powders. Atomic layer deposition provides control of film thickness in a straightforward manner by controlling the number of growth cycles.

The precursors used in an ALD process may be gaseous, liquid or solid. However, liquid or solid precursors should be volatile. The vapor pressure should be high enough for effective mass transportation. Also, solid and some liquid precursors may need to be heated inside the reaction chamber and introduced through heated tubes to the substrates. The necessary vapor pressure should be reached at a temperature below the substrate temperature to avoid the condensation of the precursors on the substrate. Due to the self-limiting growth mechanisms of ALD, relatively low vapor pressure solid precursors can be used, though evaporation rates may vary somewhat during the process because of changes in their surface area.

There are several other characteristics for precursors used in ALD. The precursors should be thermally stable at the substrate temperature, because their decomposition may destroy the surface control and accordingly the advantages of the ALD method that relies on the reaction of the precursor at the substrate surface. A slight decomposition, if slow compared to the ALD growth, may be tolerated.

The precursors should chemisorb on or react with the surface, though the interaction between the precursor and the surface as well as the mechanism for the adsorption is different for different precursors. The molecules at the substrate surface should react aggressively with the second precursor to form the desired solid film. Additionally, precursors should not react with the film to cause etching, and precursors should not dissolve in the film. Using highly reactive precursors in ALD contrasts with the selection of precursors for conventional CVD.

The by-products in the reaction should be gaseous in order to allow their easy removal from the reaction chamber. Further, the by-products should not react or adsorb on the surface.

In a reaction sequence ALD (RS-ALD) process, the self-limiting process sequence involves sequential surface chemical reactions. RS-ALD relies on chemistry between a reactive surface and a reactive molecular precursor. In an RS-ALD process, molecular precursors are pulsed into the ALD reaction chamber separately. A metal precursor reaction at the substrate is typically followed by an inert gas pulse to remove excess precursor and by-products from the reaction chamber prior to pulsing the next precursor of the fabrication sequence.

By RS-ALD, films can be layered in equal metered sequences that may all be identical in chemical kinetics, deposition per cycle, composition, and thickness. RS-ALD sequences generally deposit less than a full layer per cycle. Typically, a deposition or growth rate of about 0.25 to about 2.00 Å per RS-ALD cycle may be realized.

Processing by RS-ALD provides continuity at an interface avoiding poorly defined nucleating regions that are typical for chemical vapor deposition (<20 Å) and physical vapor deposition (<50 Å), conformality over a variety of substrate topologies due to its layer-by-layer deposition technique, use of low temperature and mildly oxidizing processes, lack of dependence on the reaction chamber, growth thickness dependent solely on the number of cycles performed, and ability to engineer multilayer laminate films with a resolution of one to two monolayers. RS-ALD processes allow for deposition control on the order of monolayers and the ability to deposit monolayers of amorphous films.

Herein, a sequence refers to the ALD material formation based on an ALD reaction of a precursor with its reactant precursor. An ALD sequence for a binary metal oxide may be referenced with respect to the metal and oxygen. For example, titanium oxide may be formed using a sequence including a $TiCl_4$ precursor and water, as its reactant precursor, where such a sequence may be referred to as a titanium/oxygen sequence or a titanium sequence. In various ALD processes that form an oxide or a compound that contains oxygen, a reactant precursor that contains oxygen is used to supply the oxygen. Herein, a precursor that contains oxygen and that supplies oxygen to be incorporated in the ALD composition formed, which may be used in an ALD process with precursors supplying the other elements in the ALD compound, is referred to as an oxygen reactant precursor. With an ALD process using $TiCl_4$ and water vapor, water vapor is an oxygen reactant precursor. An ALD cycle may include pulsing a precursor, pulsing a purging gas for the precursor, pulsing a reactant precursor, and pulsing the reactant precursor's purging gas. An ALD cycle may include pulsing a precursor, evacuating the reactant chamber, pulsing a reactant precursor, and evacuating the reactant chamber. An ALD cycle may include pulsing a precursor, pulsing a purging gas for the precursor and evacuating the reactant chamber, pulsing a reactant precursor, and pulsing the reactant precursor's purging gas and evacuating the reactant chamber.

In forming a layer of a metal species, an ALD sequence may deal with pulsing a reactant precursor to the substrate surface on which a metal-containing species has been adsorbed such that the reactant precursor reacts with the metal-containing species resulting in the metal and a gaseous by-product that can be removed during the subsequent purging/evacuating process. Alternatively, in forming a layer of a metal species, an ALD sequence may deal with reacting a precursor containing the metal species with a substrate surface. A cycle for such a metal forming sequence may include pulsing a purging gas after pulsing the precursor containing the metal species to deposit the metal. Additionally, deposition of a semiconductor material may be realized in a manner similar to forming a layer of a metal, given the appropriate precursors for the semiconductor material.

In an ALD formation of a compound having more than two elements, a cycle may include a number of sequences to provide the elements of the compound. For example, a cycle for an ALD formation of an $ABO_x$ compound may include sequentially pulsing a first precursor/a purging gas for the first precursor/a first reactant precursor/the first reactant precursor's purging gas/a second precursor/a purging gas for the second precursor/a second reactant precursor/the second reactant precursor's purging gas, which may be viewed as a cycle having two sequences. In an embodiment, a cycle may include a number of sequences for element A and a different number of sequences for element B. There may be cases in which ALD formation of an $ABO_x$ composition uses one precursor that contains the elements A and B, such that pulsing the AB containing precursor followed by its reactant precursor onto a substrate may include a reaction that forms $ABO_x$ on the substrate to provide an AB/oxygen sequence. A cycle of an AB/oxygen sequence may include pulsing a precursor containing A and B, pulsing a purging gas for the precursor, pulsing an oxygen reactant precursor to the A/B precursor, and pulsing a purging gas for the reactant precursor. A cycle may be repeated a number of times to provide a desired thickness of the composition. In an embodiment, a cycle for an ALD formation of a composition of titanium-doped indium oxide may include interspersing titanium sequences among a number of indium sequences, which may be viewed as a cycle having multiple sequences. In an embodiment, a layer substantially of an indium oxide doped with titanium is formed on a substrate mounted in a reaction chamber using ALD in repetitive indium/oxygen sequences with a limited number of titanium sequences using precursor gases individually pulsed into the reaction chamber. Solid or liquid precursors can be used in an appropriately designed reaction chamber.

In an embodiment, a titanium-doped indium oxide layer may be structured as one or more monolayers. A film of titanium-doped indium oxide, structured as one or more monolayers, may have a thickness that ranges from a monolayer to thousands of angstroms or more. The film may be processed using atomic layer deposition.

The term titanium-doped indium oxide is used herein with respect to a composition that essentially consists of indium and oxygen with a limited amount of titanium. A titanium-doped indium oxide layer is a layer in which the indium oxide may have a form that may be near stoichiometric, non-stoichiometric, or a combination of near stoichiometric and non-stoichiometric and has a limited amount of titanium. Other nomenclature for a composition that essentially consists of indium and oxygen with a limited amount of titanium may be known to those skilled in the art. Herein, a titanium-doped indium oxide compound may be expressed as Ti-doped InO, Ti-doped $InO_x$, or other equivalent form. A transparent conductive Ti-doped InO may be expressed as ITiO or other equivalent form. The expression $InO_x$ may be used to include a stoichiometric indium oxide. The expression $InO_x$ may be used to include a non-stoichiometric indium oxide. The expression $InO_x$ may be used to include a combination of a stoichiometric indium oxide and a non-stoichiometric indium oxide. The expression $TiO_y$ may be used in the same manner as $InO_x$. In various embodiments, a titanium-doped indium oxide film may be doped with elements or compounds other than titanium, indium, and oxygen.

In an embodiment, a Ti-doped $InO_x$ film may be structured as one or more monolayers. In an embodiment, the Ti-doped $InO_x$ film may be constructed using atomic layer deposition. Prior to forming the Ti-doped $InO_x$ film using ALD, the surface on which the Ti-doped $InO_x$ film is to be deposited may undergo a preparation stage. The surface may be the surface of a glass substrate. In other embodiments, silicon, germanium, gallium arsenide, silicon-on-sapphire, silicon oxide, amorphous aluminum oxide, sapphire, or other suitable substrates may be used. In an embodiment, the substrates may be of an appropriate material in single crystal form. A preparation process may include cleaning the substrate and forming layers and regions of the substrate. Alternatively, operational regions may be formed after forming the Ti-doped $InO_x$ film, depending on the over-all fabrication process implemented. In an embodiment, the substrate is cleaned to provide an initial substrate depleted of its native oxide. In an embodiment, the initial substrate is cleaned also to provide a hydrogen-terminated surface. In an embodiment, a substrate undergoes a final hydrofluoric (HF) rinse prior to ALD processing to provide the substrate with a hydrogen-terminated surface without a native oxide layer.

In various embodiments, between each pulsing of a precursor used in an atomic layer deposition process, a purging gas may be pulsed into the ALD reaction chamber. Between each pulsing of a precursor, the ALD reactor chamber may be evacuated using vacuum techniques as is known by those skilled in the art. Between each pulsing of a precursor, a purging gas may be pulsed into the ALD reaction chamber and the ALD reactor chamber may be evacuated.

In an embodiment, layers of titanium oxide formed by atomic layer deposition may be interspersed among layers of indium oxide that are formed by atomic layer deposition. The titanium oxide and indium oxide layers may be annealed to form transparent conductive titanium-doped indium oxide. In an embodiment, the concentration of titanium oxide is less than 7% in the layers of titanium oxide and indium oxide layers to be annealed. In an embodiment, a transparent conductive film of titanium-doped indium has a titanium atomic concentration less than or equal to 7%. In an embodiment, a transparent conductive film of titanium-doped indium has an atomic concentration of titanium ranging from 1% to 3%.

To form indium oxide by atomic layer deposition, an indium-containing precursor is pulsed onto a substrate in an ALD reaction chamber. A number of precursors containing indium may be used to provide the indium to a substrate. In an embodiment, a precursor containing indium may include an indium halide. $InCl_3$ may be used as a precursor in an indium sequence. In an embodiment using an $InCl_3$ precursor, the substrate temperature may be maintained at a temperature of about 500° C. In an embodiment, the $InCl_3$ precursor may be evaporated from a crucible held at 285° C. within the ALD system. After pulsing the $InCl_3$ precursor and purging the reaction chamber of excess precursor and by-products from pulsing the precursor, a reactant precursor may be pulsed into the reaction chamber. Water vapor may be used as an oxygen reactant and may be generated in a reservoir held in a tempered bath at 25° C. Inert gas valving may be used to pulse the InCl$_3$ precursor while closing out water vapor with a solenoid valve. Use of an InCl$_3$ precursor and water vapor is not limited to the temperature ranges of the above example embodiment. The indium oxide may be formed on a glass substrate. Other materials may be used for the substrate depending on the application. In various embodiments, after pulsing the indium-containing precursor and purging the reaction chamber of excess precursor and by-products from pulsing the precursor, a reactant precursor may be pulsed into the reaction chamber. The reactant precursor may be an oxygen reactant precursor including, but not limited to, one or more of water vapor, atomic oxygen, molecular oxygen, ozone, hydrogen peroxide, a water—hydrogen peroxide mixture, alcohol, or nitrous oxide. In various embodiments, use of the individual indium-containing precursors is not limited to the temperature ranges of the above example embodiments. Further, forming indium oxide by atomic layer deposition is not limited to the abovementioned precursors. In addition, the pulsing of the indium precursor may use a pulsing period that provides uniform coverage of a monolayer on the surface or may use a pulsing period that provides partial coverage of a monolayer on the surface during an indium sequence.

To form titanium oxide by atomic layer deposition, a titanium-containing precursor is pulsed onto a substrate in an ALD reaction chamber. A number of precursors containing titanium may be used to provide the titanium on the substrate. In an embodiment, the titanium-containing precursor may be TiCl$_4$. In an embodiment using a TiCl$_4$ precursor, the substrate temperature may be maintained at a temperature ranging from about 100° C. to about 500° C. In an embodiment using a TiCl$_4$ precursor, the substrate temperature may be maintained at a temperature of about 425° C. or higher. In an embodiment, using a TiCl$_4$ precursor with water vapor as an oxygen reactant in the formation of titanium oxide allows for epitaxial growth of rutile. In an embodiment, a titanium precursor pulsed may be TiI$_4$. In an embodiment using a TiI$_4$ precursor, the substrate temperature may be maintained between about 230° C. and about 490° C. A TiI$_4$ precursor may be used with H$_2$O$_2$ as an oxygen reactant to form thin films of epitaxial titanium oxide at relatively low temperatures. In an ALD process using TiI$_4$ and H$_2$O$_2$ precursors, both rutile and anatase phases may be formed. Typically, anatase is formed at lower temperatures. The substrate material may affect the anatase/rutile phase boundary temperature. Phase-pure rutile has been shown to be attainable on a-Al$_2$O$_3$ (0 1 2) at temperatures of 275° C. or higher. Phase-pure anatase has been shown to be attainable on MgO (0 0 1) at temperatures of 375° C. or less. In an embodiment, a titanium precursor pulsed may be anhydrous Ti(NO$_3$)$_4$. In an embodiment using a Ti(NO$_3$)$_4$ precursor, the substrate temperature may be maintained at a temperature ranging from less than 250° C. to about 700° C. In an embodiment, a titanium precursor pulsed may be titanium tetraisopropoxide, also written as Ti(O$^i$—Pr)$_4$. In an embodiment using a Ti(O$^i$—Pr)$_4$ precursor, the substrate temperature may be maintained at a temperature ranging from less than 250° C. to about 325° C. Use of the individual titanium precursors is not limited to the temperature ranges of the above embodiments. In various embodiments, after pulsing the titanium-containing precursor and purging the reaction chamber of excess precursor and by-products from pulsing the precursor, a reactant precursor may be pulsed into the reaction chamber. The reactant precursor may be an oxygen reactant precursor including, but not limited to, one or more of water vapor, atomic oxygen, molecular oxygen, ozone, hydrogen peroxide, a water—hydrogen peroxide mixture, alcohol, or nitrous oxide. In addition, the pulsing of the titanium precursor may use a pulsing period that provides uniform coverage of a monolayer on the surface or may use a pulsing period that provides partial coverage of a monolayer on the surface during a titanium sequence.

In various embodiments, nitrogen may be used as a purging gas and a carrier gas for one or more of the sequences. Alternatively, hydrogen, argon gas, or other inert gases may be used as the purging gas. Excess precursor gas and reaction by-products may be removed by the purge gas. Excess precursor gas and reaction by-products may be removed by evacuation of the reaction chamber using various vacuum techniques. Excess precursor gas and reaction by-products may be removed by the purge gas and by evacuation of the reaction chamber.

Atomic layer deposition of the individual components or layers of InO$_x$ and TiO$_y$ allows for individual control of each precursor pulsed into the reaction chamber. Thus, each precursor is pulsed into the reaction chamber for a predetermined period, where the predetermined period can be set separately for each precursor. Additionally, for various ALD formations, each precursor may be pulsed into the reaction chamber under separate environmental conditions. The substrate may be maintained at a selected temperature and the reaction chamber maintained at a selected pressure independently for pulsing each precursor. Appropriate temperatures and pressures may be maintained, whether the precursor is a single precursor or a mixture of precursors.

In an embodiment, a number of indium oxide layers and a number of titanium oxide layers may be formed by atomic layer deposition, where the number of titanium oxide layers is selected to be significantly less than the number of indium oxide layers. Then, the indium oxide layers and the titanium oxide layers may be annealed to form titanium-doped indium oxide. In an embodiment, the number of titanium oxide layers is selected such that the percentage of titanium oxide in the total number of indium oxide layers and titanium oxide layers is less than or equal to 7%. In an embodiment, the number of titanium oxide layers is selected such that the atomic concentration of titanium in the formed Ti-doped indium oxide is less than or equal to 7%. In an embodiment, the number of titanium oxide layers may be interspersed among the number of indium oxide layers in a predetermined arrangement prior to annealing. In an embodiment, the number of titanium oxide layers may be interspersed among the number of indium oxide layers in a random order prior to annealing. In various embodiments, the order of forming InO$_x$ and TiO$_y$ layers may be permutated. The annealing may be conducted in a nitrogen ambient. In an embodiment, annealing may be conducted in a nitrogen ambient having a small amount of oxygen. However, annealing is not limited to these ambient conditions. In an embodiment, annealing may performed at 550° C. or higher. In an embodiment, annealing may performed for about 60 minutes. Other annealing temperatures and annealing times may be used.

In an embodiment, a layer of indium oxide and a layer of titanium oxide are each grown by atomic layer deposition to a thickness such that annealing these layers at appropriate temperatures essentially converts these layers to a layer of titanium-doped indium oxide. In the various embodiments, the thickness of a titanium-doped indium oxide film is related to the number of ALD cycles performed and the growth rate associated with forming each layer of InO$_x$ and TiO$_y$. In an embodiment, a Ti-doped InO film may be grown to a desired thickness by repetition of a process including atomic layer deposition of layers of InO$_x$ and TiO$_y$ followed by annealing. In an embodiment, a base thickness may be formed according to various embodiments such that forming a predetermined thickness of a Ti-doped InO film may be conducted by forming a number of layers having the base thickness. As can be understood by one skilled in the art, determining the base thickness depends on the application and can be determined during initial processing without undue experimentation. Relative amounts of indium, titanium, and oxygen in a Ti-doped InO film may be controlled by regulating the relative thicknesses of the individual layers of oxides formed. In addition, relative amounts of indium, titanium, and oxygen in a Ti-doped InO film may be controlled by forming a layer of Ti-doped InO as multiple layers of different base thickness and by regulating the relative thicknesses of the individual layers of oxides formed in each base layer prior to annealing. Such regulation may be used to form an indium oxide layer having a selected titanium doping profile. The doping profile may include graded titanium doping decreasing away from the substrate on which the indium oxide layer is formed. The doping profile may include graded titanium doping increasing away from the substrate on which the indium oxide layer is formed. The doping profile may include having the largest concentrations of titanium at the ends of the indium oxide layer. The doping profile may include having the largest concentrations of titanium in a middle region in the indium oxide layer. The titanium doping profile is not limited to these embodiments, but may have a profile selected for a given application. As can be understood by those skilled in the art, particular effective growth rates for the engineered titanium-doped indium oxide film can be determined during normal initial testing of the ALD system used in processing a transparent conductive titanium-doped indium oxide for a given application without undue experimentation.

In an alternative embodiment, an ALD cycle for forming Ti-doped InO may include sequencing the component-containing precursors in various permutations. In an embodiment, an ALD cycle to form titanium-doped indium oxide may include a number, x, of indium/oxygen sequences and a number, y, of titanium/oxygen sequences. The number of sequences x and y may be selected to engineer the relative amounts of indium, titanium, and oxygen. In an embodiment, the number of sequences x and y may be selected to form a titanium-doped indium oxide having a titanium concentration less than a predetermined amount. In an embodiment, the predetermined amount is less than or equal to 7%. Such a process may be conducted as an ALD process in which a number of titanium/oxygen cycles are substituted for indium/oxygen cycles in the formation of indium oxide.

After repeating a selected number of ALD cycles, a determination may be made as to whether the number of cycles equals a predetermined number to form the desired titanium-doped indium oxide layer. If the total number of cycles to form the desired thickness has not been completed, a number of cycles is repeated. The thickness of a titanium-doped indium oxide layer formed by atomic layer deposition may be determined by a fixed growth rate for the pulsing periods and precursors used, set at a value such as N nm/cycle, and the number of cycles conducted. Depending on the precursors used for ALD formation of a Ti-doped InO film, the process may be conducted in an ALD window, which is a range of temperatures in which the growth rate is substantially constant. If such an ALD window is not available, the ALD process may be conducted at the same set of temperatures for each ALD sequence in the process. For a desired titanium-doped indium oxide layer thickness, t, in an application, the ALD process is repeated for t/N total cycles. Once the t/N cycles have completed, no further ALD processing for the titanium-doped indium oxide layer may be required. A titanium-doped indium oxide layer processed at relatively low temperatures associated with atomic layer deposition may provide an amorphous layer. In an embodiment, different ALD cycles having different numbers of indium sequences and titanium sequences may be used to form an indium oxide layer with a selected titanium doping profile. Various titanium doping profiles may by constructed, as discussed above with respect to embodiments in which ALD indium oxide layers and ALD titanium oxide layers are annealed to form a Ti-doped InO layer.

FIG. 1A illustrates a representation of an embodiment of a flat panel display 100 having a transparent conductive Ti-doped InO film as a TCO 110. Flat panel display 100 may include a phosphor layer 120 separated by a dielectric layer 130 from TCO layer 110 and separated by a dielectric layer 140 from a conductive layer 150. Conductive layer 150 may be a metal layer. TCO layer 110 and conductive layer 150 are configured to contact an appropriate voltage source, which enables a voltage, $V_{APPLIED}$, to be applied between TCO layer 110 and conductive layer 150. Various types or configurations of voltage sources may be used to provide $V_{APPLIED}$. Dielectric layer 130 has a thickness 132, phosphor layer 120 has a thickness 122, and dielectric layer 140 has a thickness 142.

Figure 1B:
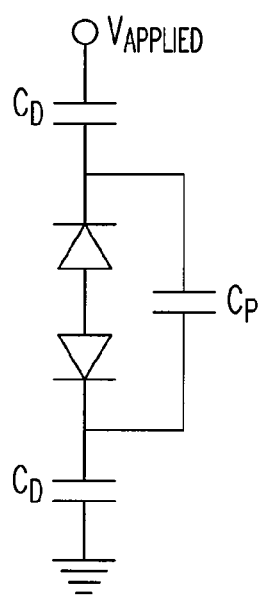
FIG. 1B shows a circuit diagram of an embodiment representative of the flat panel display of FIG. 1A.
Figure 1C:
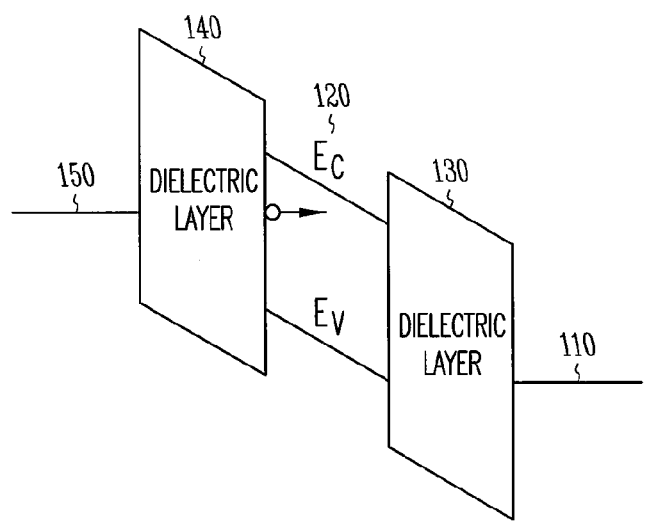
FIG. 1C shows a representation of an energy diagram of an embodiment of the flat panel display of FIG. 1A.

FIG. 1B shows a circuit diagram of an embodiment representative of flat panel display 100 of FIG. 1A. In this embodiment, the effective circuit has a capacitance, $C_P$, associated with phosphor layer 120 and a capacitance, $C_D$, associated both with dielectric layer 130 having thickness 132 and dielectric layer 140 having thickness 142. Such capacitances $C_D$ may be obtained using the same material with the same dimensions for both dielectric layer 130 and dielectric layer 140. Other configurations may be used including having dielectric layer 130 and dielectric layer 140 with different capacitance values. FIG. 1C shows a representation of an energy diagram of an embodiment of flat panel display 100 of FIG. 1A.

Figure 2:
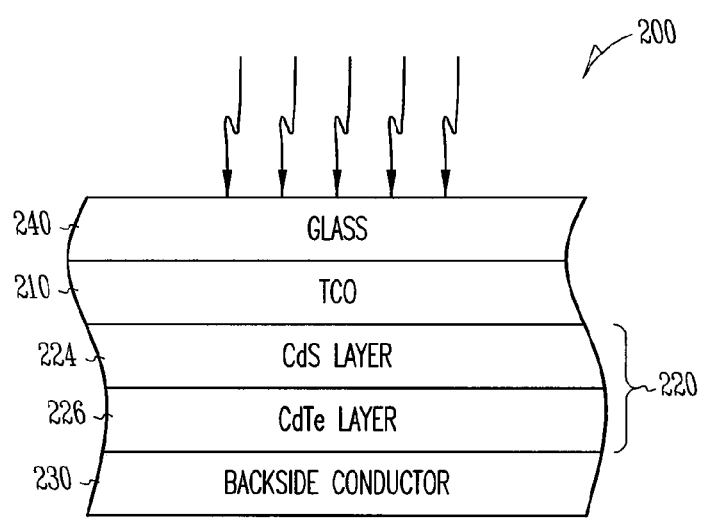
FIG. 2 illustrates a representation of an embodiment of an apparatus having a photovoltaic cell contacting a transparent conductive titanium-doped indium oxide film as a front-side transparent conductive oxide layer.

FIG. 2 illustrates a representation of an embodiment of an apparatus 200 having a photovoltaic cell 220 contacting a transparent conductive Ti-doped InO film as a front-side TCO layer 210. Photovoltaic cell 220 may have a multiple layer structure. In an example embodiment, photovoltaic cell 220 includes a CdS layer 224 and a CdTe layer 226. Photovoltaic 220 is not limited to these materials or layer configurations. In addition to having TCO layer 210 as a contact, photovoltaic cell 220 contacts a backside conductor 230. Backside conductor 230 may be a metal layer. A transparent layer 240 may be disposed on TCO layer 210. Transparent layer 240 may be a glass layer.

Figure 3A:
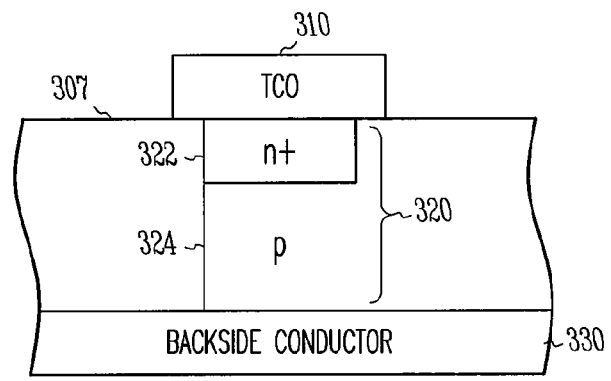
FIG. 3A illustrates a representation of a cross sectional view of a light emitting diode having a transparent conductive titanium-doped indium oxide film as a transparent conductive oxide contact.
Figure 3B:
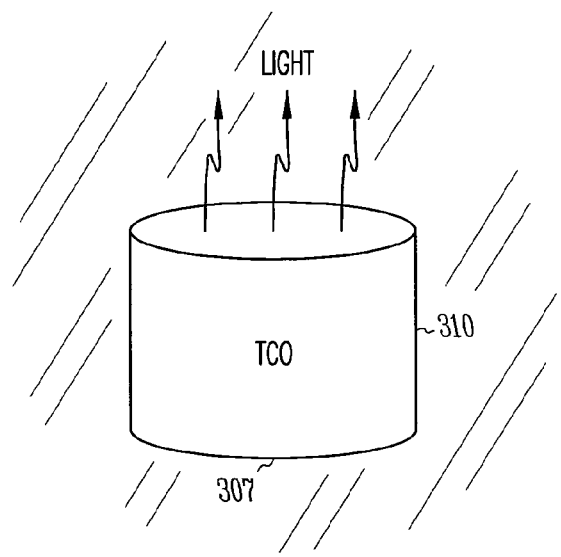
FIG. 3B illustrates a representation of a top view of the light emitting diode on a semiconductor surface of FIG. 3A.

FIG. 3A illustrates a representation of a cross sectional view of a light emitting diode (LED) 320 having a transparent conductive Ti-doped InO film as a TCO contact 310. FIG. 3B illustrates a representation of a top view of TCO contact 310 on a semiconductor surface 307 of FIG. 3A. Light emitting diode 320 includes a backside contact 330, which is used with TCO contact 310 to provide a potential to LED 320. LED 320 includes a n-type region 322 and a p-type region 324. N-type region may be an n+ region. A transparent conductive Ti-doped InO film as a TCO contact is not limited to the configuration of FIGS. 3A-3B, but may be used in various configurations with various materials and doping levels for a light emitting diode. Further, a transparent conductive Ti-doped InO film may be used in any light emitting structure that has a contact layer in which light generated in an underlying region is to be transmitted through the contact layer. A transparent conductive Ti-doped InO film for a light emitting structure is not limited to an LED. Other such structures include semiconductor-based lasers.

Figure 4:
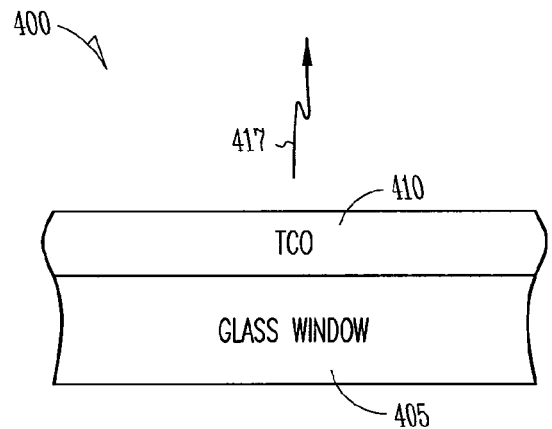
FIG. 4 shows a representation of an embodiment of a transparent conductive titanium-doped indium oxide film as a low emissivity transparent conductive oxide layer of a smart window.

FIG. 4 shows a representation of an embodiment of a transparent conductive Ti-doped InO layer as a low emissivity transparent conductive oxide layer 410 of a smart window 400. A smart window is a window in which properties associated with the window may be controlled. For example, a smart window may be constructed such that the amount of light passing through the window may be regulated. TCO layer 410 is disposed on glass window 405. Glass window 405 may include any typical material to be used as a window. Transparent conductive Ti-doped InO layer 410 may be electrically controlled through contacts to TCO 410 layer to modify the radiative emissivity of smart window 400. In an embodiment, transparent conductive Ti-doped InO layer 410 is adapted to give smart window 400 low emissivity to provide low heat loss 417. Embodiments of a transparent conductive Ti-doped InO layer as a low emissivity TCO layer for a smart window are not limited to the configuration of FIG. 4.

Figure 5:
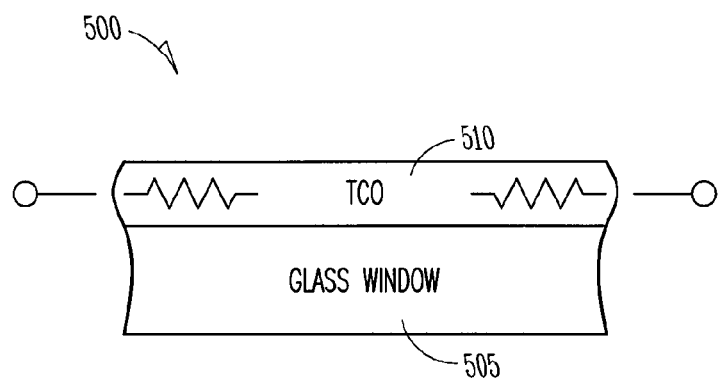
FIG. 5 shows a representation of an embodiment of a transparent conductive titanium-doped indium oxide film as a transparent conductive oxide layer to heat a smart window.

FIG. 5 shows a representation of an embodiment of a transparent conductive Ti-doped InO layer as a TCO layer 510 to heat a smart window 500. Smart window 500 includes TCO layer 510 on a layer of glass 505. TCO layer may be used as a resistive element to control heating of smart window 500. With no current flowing through TCO layer 510, smart window 500 may operate as a conventional window. Embodiments of a transparent conductive Ti-doped InO layer to heat a smart window are not limited to the configuration of FIG. 5.

Figure 6:
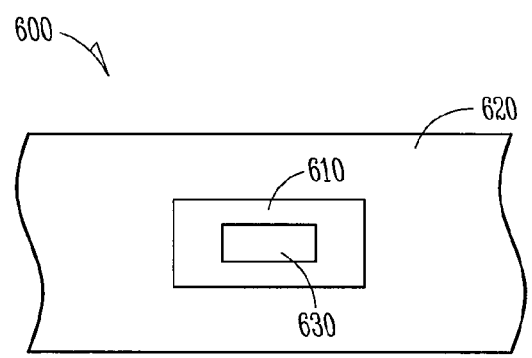
FIG. 6 depicts a representation of an embodiment of a transparent conductive titanium-doped indium oxide film as a transparent conductive oxide layer for an optical waveguide structure.

FIG. 6 depicts a representation of an embodiment of a transparent conductive Ti-doped InO film as a TCO layer for an optical waveguide structure 600. Optical waveguide structure 600 includes at least two regions 620, 630, where region 620 has a different index or refraction than region 630. Regions 620 and 630 are separated by a TCO layer 610 containing transparent conductive Ti-doped InO. Layer 610 may have shaped and have a thickness based on the application of the layer 610 in an optical waveguide configuration. In an embodiment, region 620 is a cladding region having a high index of refraction and coating region 610 is part of the optical waveguide region having a lower index of refraction. Region 630 is the core region where a guided wave is constrained.

Figure 7:
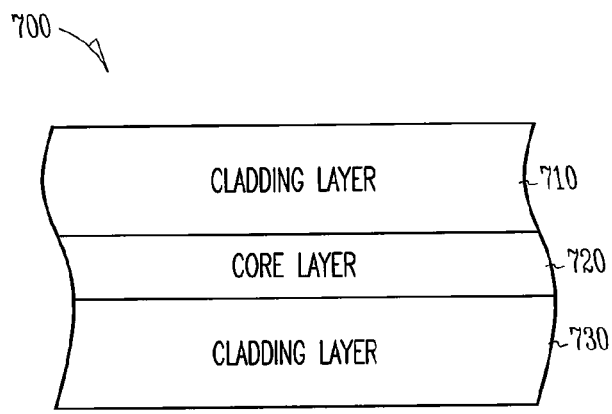
FIG. 7 depicts a representation of an embodiment of a transparent conductive titanium-doped indium oxide film as a transparent conductive oxide layer for an optical waveguide structure.

FIG. 7 depicts a representation of an embodiment of a transparent conductive Ti-doped InO film as a TCO layer for an optical waveguide structure 700. Optical waveguide structure 700 includes a core layer 720, a cladding layer 710, and a cladding layer 730 in which at least one of cladding layer 710 and cladding layer 730 contains a layer of transparent conductive Ti-doped InO. Core layer 720 is an optic layer. An optic layer is a layer used for propagation of light or used to modify propagation of light. In an embodiment, with optical waveguide structure 700 in a planar-like configuration cladding layer 710 and cladding layer 730 are different layers. In such a configuration, the material used in cladding layer 710 may be the same as the material used in cladding layer 730. In such a configuration, the material used in cladding layer 710 may be different from the material used in cladding layer 730. In such a configuration, the material used in cladding layer 710 may have an index of refraction different from the index of refraction of the material used in cladding layer 730, where both indexes are less than the index of refraction for core layer 720. In an embodiment, with optical waveguide structure in a planar-like configuration, optical waveguide structure 700 is not limited to a three layer structure, but may have additional dependent on the application. Optical waveguide structures in a planar-like configuration are used in integrated optics. In an embodiment, with optical waveguide structure in a cylindrical-like configuration, cladding layer 710 and cladding 730 are the same layer. In such a cylindrical-like configuration, core layer 720 and cladding layer 710/730 may have various shapes including but not limited to, a circular outer surface and an elliptical outer surface. Optical waveguide structures in a cylindrical-like configuration include optical fibers.

In an embodiment, core layer 720 may be an electrooptic material whose index of refraction may be modified in the presence of an applied potential. With contacts applied to TCO cladding layers 710 and 730, TCO cladding layers 710 and 730 may be used to modulate the index of refraction of core layer 720. The material for electrooptic core layer 720 may be selected such that for all modulations of an application, the index of refraction of core layer 720 is maintained at a higher index than for cladding layers 710, 730.

Figure 8:
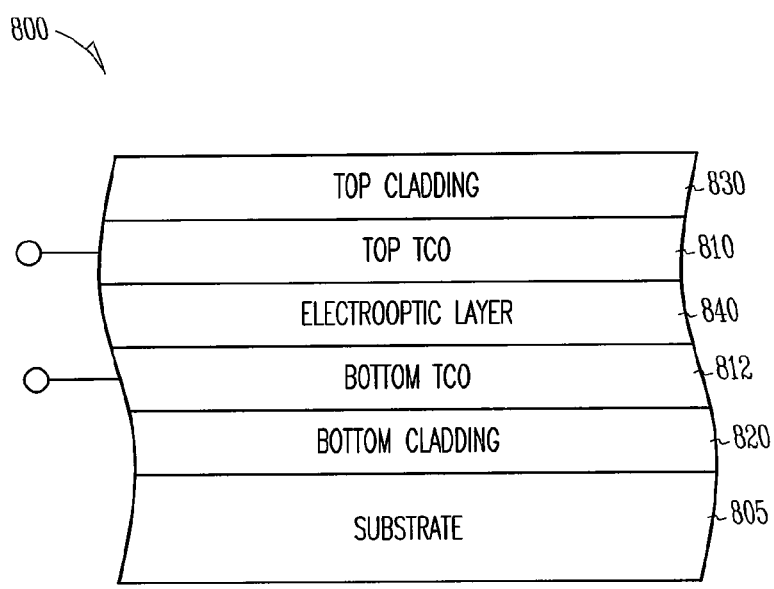
FIG. 8 depicts a representation of an embodiment of an apparatus having a transparent conductive titanium-doped indium oxide film as a transparent conductive oxide layer to provide electrooptic modulation.

FIG. 8 depicts a representation of an embodiment of an apparatus 800 having a transparent conductive Ti-doped InO film as a TCO layer to provide electrooptic modulation. In an embodiment, apparatus 800 includes a substrate 805, a bottom cladding layer 820, a top cladding layer 830, and a layer 840 of electrooptic material between bottom cladding layer 820 and a top cladding layer 830. Layer 840 of electrooptic material is an optical layer. Substrate 805 may be GaAs or other III-V composition. Cladding material may include silicon oxide or other appropriate dielectric material. Electrodes are provided to modulate the optical properties of electrooptic material 840. Electrooptic material 840 may be modulated using a top TCO layer 810 and a bottom TCO layer 812. At least one of the TCO layers 810, 812 may contain transparent conductive Ti-doped InO. In an embodiment, both TCO layers 810, 812 contain transparent conductive Ti-doped InO. The materials selected for substrate 805, bottom cladding layer 820, top cladding layer 830, and layer 840 may be chosen based on the characteristics of the application, such as the wavelengths of interest.

Figure 9:
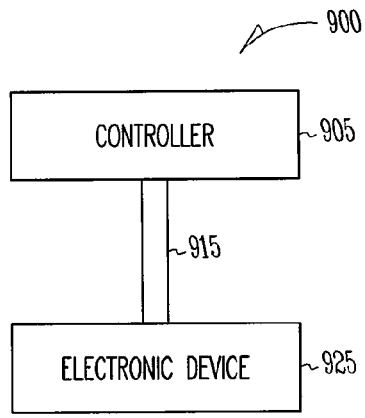
FIG. 9 illustrates a block diagram for a system having one or more devices having a structure including a transparent conductive titanium-doped indium oxide film.

FIG. 9 illustrates a block diagram for a system 900 having one or more devices having a structure including a transparent conductive Ti-doped InO film. The Ti-doped InO TCO layer may be structured as one or more monolayers, where the thickness of the Ti-doped InO TCO layer may range from a monolayer to thousands of angstroms or more. The Ti-doped InO TCO film may be processed using atomic layer deposition. Electronic system 900 includes a controller 905, a bus 915, and a device 925, where bus 915 provides electrical conductivity between controller 905 and device 925. In various embodiments, device 925 may include an embodiment of a transparent conductive Ti-doped InO film. System 900 may include, but is not limited to, fiber optic systems, electro-optic systems, information handling systems, and systems having smart windows.

Figure 10:
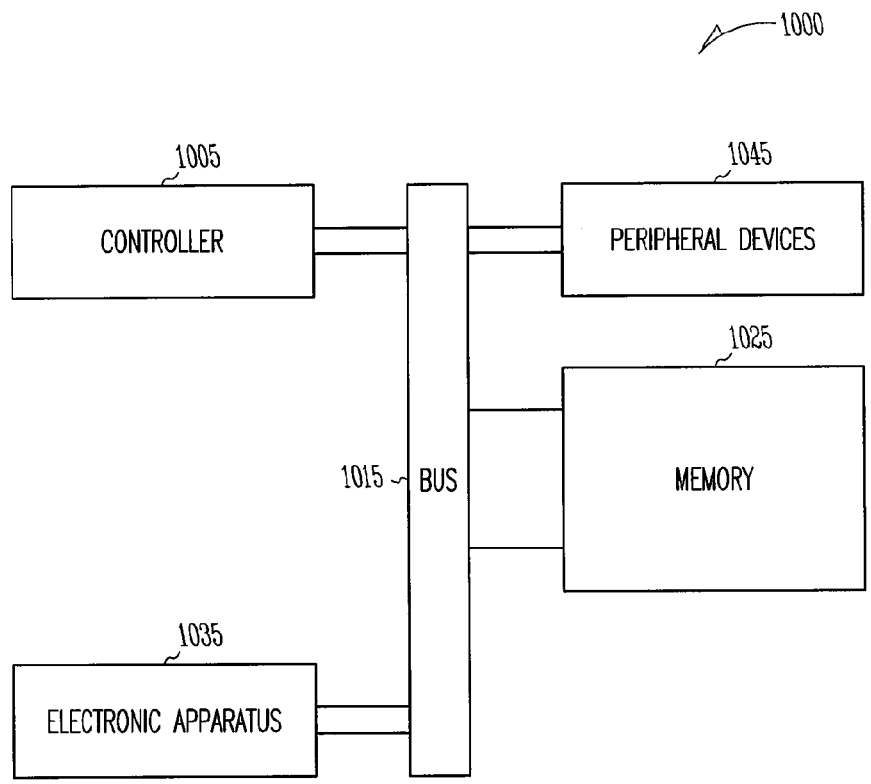
FIG. 10 shows a block diagram of an embodiment of a system having a controller coupled to various devices, in which at least one device contains a transparent conductive titanium-doped indium oxide film.

FIG. 10 shows a block diagram of an embodiment of a system 1000 having a controller 1005 coupled to various devices, in which at least one device contains a transparent conductive Ti-doped InO film. System 1000 may include a memory 1025, an apparatus 1035, and a bus 1015, where bus 1015 provides electrical conductivity between controller 1005 and apparatus 1035 and between controller 1005 and memory 1025. Bus 1015 may include an address bus, a data bus, and a control bus, each independently configured. Alternatively, bus 1015 may use common conductive lines for providing one or more of address, data, or control, the use of which is regulated by controller 1005. In an embodiment, apparatus 1035 may include a transparent conductive Ti-doped $InO_x$ film. Apparatus 1035 may be configured as a flat-panel display, a photovoltaic cell, a smart window, a light emitting diode, light emitting diode array, a light generating device, an optical waveguide, or other apparatus arranged to use a transparent conductive Ti-doped $InO_x$ film. An embodiment may include an additional peripheral device or devices 1045 coupled to bus 1015. Peripheral devices 1045 may include displays, additional storage memory, or other control devices that may operate in conjunction with controller 1005. Alternatively, peripheral devices 1045 may include displays, additional storage memory, or other control devices that may operate in conjunction with memory 1025, or controller 1005 and memory 1025. Peripheral devices 1045 may include other devices having a transparent conductive Ti-doped $InO_x$ film.

In an embodiment, controller 1005 is a processor. Memory 1025 may be realized as various types of memory devices. It will be understood that embodiments are equally applicable to any size and type of memory circuit and are not intended to be limited to a particular type of memory device. Memory types include a DRAM, SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as other emerging DRAM technologies. System 1000 may include, but is not limited to, fiber optic systems, electro-optic systems, information handling systems, and systems having smart windows.

Although specific embodiments have been illustrated and described herein, it will be appreciated by those of ordinary skill in the art that any arrangement that is calculated to achieve the same purpose may be substituted for the specific embodiments shown. It is to be understood that the above description is intended to be illustrative, and not restrictive, and that the phraseology or terminology employed herein is for the purpose of description and not of limitation. Combinations of the above embodiments and other embodiments will be apparent to those of skill in the art upon studying the above description.

What is claimed is:

1. A method comprising:
    forming indium oxide by a monolayer or partial monolayer sequencing processing; and
    doping the indium oxide with titanium, forming a transparent conductive titanium-doped indium oxide.

2. The method of claim 1, wherein forming the transparent conductive titanium-doped indium oxide includes forming the transparent conductive titanium-doped indium oxide with a titanium atomic concentration less than or equal to 7%.

3. The method of claim 1, wherein forming the transparent conductive titanium-doped indium oxide includes forming the transparent conductive titanium-doped indium oxide with an atomic concentration of titanium ranging from 1% to 3%.

4. The method of claim 1, wherein the method includes forming the conductive titanium-doped indium oxide in a flat-panel display.

5. The method of claim 1, wherein the method includes forming the transparent conductive titanium-doped indium oxide in a photovoltaic cell.

6. The method of claim 1, wherein the method includes forming the transparent conductive titanium-doped indium oxide in a smart window.

7. The method of claim 1, wherein the method includes forming the transparent conductive titanium-doped indium oxide in a light emitting diode array.

8. The method of claim 1, wherein the method includes forming the transparent conductive titanium-doped indium oxide in an optical waveguide.

9. The method of claim 1, wherein the doping the indium oxide with titanium includes using a titanium precursor that contains oxygen.

10. A method comprising:
    forming indium oxide by a monolayer or partial monolayer sequencing process; and
    providing titanium for the indium oxide by the monolayer or partial monolayer sequencing process; and
    controlling indium sequences and titanium sequences in a number of cycles of the monolayer or partial monolayer sequencing process such that the indium oxide is doped with titanium, forming a transparent conductive titanium-doped indium oxide.

11. The method of claim 10, wherein controlling indium sequences and titanium sequences includes performing different cycles of the monolayer or partial monolayer sequencing process having different numbers of indium sequences and titanium sequences to form the transparent conductive titanium-doped indium oxide.

12. The method of claim 10, wherein the method includes controlling the indium sequences and the titanium sequences such that the titanium of the transparent conductive titanium-doped indium oxide has a graded titanium doping profile.

13. The method of claim 12, wherein the graded titanium doping profile includes a concentration of titanium at a first end of a region containing the transparent conductive titanium-doped indium oxide and at a second end distal from the first end that is larger than a titanium concentration in the region between the first end and the second end.

14. The method of claim 12, wherein the graded titanium doping profile includes titanium decreasing away from a substrate on which the transparent conductive titanium-doped indium oxide is formed.

15. The method of claim 12, wherein the graded titanium doping profile includes titanium increasing away from a substrate on which the transparent conductive titanium-doped indium oxide is formed.

16. A method comprising:
    forming indium oxide by a monolayer or partial monolayer sequencing processing;
    forming titanium oxide by the monolayer or partial monolayer sequencing processing; and
    processing the formed indium oxide and the formed titanium oxide such that the indium oxide is doped with titanium, forming a transparent conductive titanium-doped indium oxide.

17. The method of claim 16, wherein processing the formed indium oxide and the formed titanium oxide includes annealing the indium oxide and the titanium oxide converting the indium oxide and the titanium oxide to transparent conductive titanium-doped indium oxide.

18. The method of claim 16, wherein the method includes forming a base thickness of the transparent conductive titanium-doped indium oxide and repeating forming the base thickness until a desired thickness of transparent conductive titanium-doped indium oxide is formed.

19. The method of claim 16, wherein processing the formed indium oxide and the formed titanium oxide includes regulating relative thicknesses of individual layers of formed indium oxide and formed titanium oxide and annealing the formed individual layers to convert the formed indium oxide and formed titanium oxide to transparent conductive titanium-doped indium oxide.

20. The method of claim 19, wherein processing the formed indium oxide and the formed titanium oxide includes using the regulation such that transparent conductive titanium-doped indium oxide having a selected titanium doping profile is formed.

* * * * *